(12) United States Patent
Takeshita

(10) Patent No.: US 11,581,868 B2
(45) Date of Patent: Feb. 14, 2023

(54) ACOUSTIC WAVE DEVICE

(71) Applicant: Murata Manufacturing Co., Ltd., Nagaokakyo (JP)

(72) Inventor: Toru Takeshita, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 400 days.

(21) Appl. No.: 16/837,050

(22) Filed: Apr. 1, 2020

(65) Prior Publication Data

US 2020/0228090 A1 Jul. 16, 2020

Related U.S. Application Data

(63) Continuation of application No. PCT/JP2018/038605, filed on Oct. 17, 2018.

(30) Foreign Application Priority Data

Oct. 19, 2017 (JP) .............................. JP2017-202387

(51) Int. Cl.
*H03H 9/10* (2006.01)
*H03H 9/17* (2006.01)
(Continued)

(52) U.S. Cl.
CPC ................ *H03H 9/17* (2013.01); *H03H 9/05* (2013.01); *H03H 9/0504* (2013.01); *H03H 9/1042* (2013.01); *H03H 9/132* (2013.01)

(58) Field of Classification Search
CPC .... H03H 3/08; H03H 9/0009; H03H 9/02007; H03H 9/02031; H03H 9/02535;
(Continued)

(56) References Cited

U.S. PATENT DOCUMENTS

2004/0226162 A1 11/2004 Miura et al.
2007/0252481 A1* 11/2007 Iwamoto .............. H03H 9/1092
310/344
(Continued)

FOREIGN PATENT DOCUMENTS

JP 2004-343359 A 12/2004
JP 2007-318058 A 12/2007
(Continued)

OTHER PUBLICATIONS

Official Communication issued in International Patent Application No. PCT/JP2018/038605, dated Jan. 8, 2019.

*Primary Examiner* — Levi Gannon
(74) *Attorney, Agent, or Firm* — Keating & Bennett, LLP

(57) ABSTRACT

An acoustic wave device includes an acoustic wave substrate including a first main surface and a second main surface, IDT electrodes provided on the first main surface, and sealing resin covering at least the second main surface of the acoustic wave substrate. A hollow is provided in a region where the IDT electrodes on the first main surface of the acoustic wave substrate is located. The sealing resin has through-holes each extending from a top surface 13B of the sealing resin to the second main surface of the acoustic wave substrate. The acoustic wave substrate is made of silicon or includes a layer made of silicon.

18 Claims, 7 Drawing Sheets

(51) Int. Cl.
   *H03H 9/05*   (2006.01)
   *H03H 9/13*   (2006.01)
(58) Field of Classification Search
   CPC .... H03H 9/02574; H03H 9/05; H03H 9/0504;
           H03H 9/0571; H03H 9/0576; H03H
           9/058; H03H 9/10; H03H 9/1007; H03H
           9/1042; H03H 9/1064; H03H 9/1085;
           H03H 9/1092; H03H 9/132; H03H 9/17;
           H03H 9/25; H01L 23/00; H01L 23/08
   See application file for complete search history.

(56) References Cited

U.S. PATENT DOCUMENTS

| | | | |
|---|---|---|---|
| 2008/0308223 A1 | 12/2008 | Sakairi et al. | |
| 2015/0243875 A1* | 8/2015 | Hira | H01L 41/0533 310/313 R |
| 2017/0033763 A1* | 2/2017 | Hira | H03H 3/08 |
| 2018/0102758 A1 | 4/2018 | Uesaka | |
| 2018/0159497 A1 | 6/2018 | Iwamoto et al. | |
| 2018/0214874 A1* | 8/2018 | Koksal | G01N 29/22 |
| 2018/0241370 A1 | 8/2018 | Sekiya et al. | |

FOREIGN PATENT DOCUMENTS

| | | | | |
|---|---|---|---|---|
| JP | 2009-021559 A | | 1/2009 | |
| JP | 2012-253120 A | | 12/2012 | |
| JP | 2014-112607 A | | 6/2014 | |
| JP | 2016-123020 A | | 7/2016 | |
| WO | WO 2016/088681 | * | 6/2016 | H03H 3/08 |
| WO | 2016/199480 A1 | | 12/2016 | |
| WO | 2017/043427 A1 | | 3/2017 | |
| WO | 2017/098809 A1 | | 6/2017 | |

* cited by examiner

ACOUSTIC WAVE DEVICE

CROSS REFERENCE TO RELATED APPLICATIONS

This application claims the benefit of priority to Japanese Patent Application No. 2017-202387 filed on Oct. 19, 2017 and is a Continuation Application of PCT Application No. PCT/JP2018/038605 filed on Oct. 17, 2018. The entire contents of each application are hereby incorporated herein by reference.

BACKGROUND OF THE INVENTION

1. Field of the Invention

The present invention relates to acoustic wave devices, and more specifically, to an acoustic wave device in which an acoustic wave substrate provided with interdigital-transducer (IDT) electrodes is sealed with sealing resin.

2. Description of the Related Art

Hitherto, acoustic wave devices have been widely used in electronic apparatuses such as mobile communication apparatuses.

In some acoustic wave devices, an acoustic wave substrate provided with IDT electrodes is sealed with sealing resin for the purpose of, for example, protection of the IDT electrodes from external factors.

An acoustic wave device including an acoustic wave substrate sealed with sealing resin is disclosed by Japanese Unexamined Patent Application Publication No. 2009-21559. FIG. 7 illustrates an acoustic wave device 1100 disclosed in Japanese Unexamined Patent Application Publication No. 2009-21559.

The acoustic wave device 1100 includes an acoustic wave substrate (SAW chip) 101. The acoustic wave substrate 101 is provided with IDT electrodes 102 on one main surface (a main surface on the lower side in the figure) thereof. The acoustic wave substrate 101 is made of, for example, lithium tantalate ($LiTaO_3$) or the like.

The acoustic wave device 1100 includes a ceramic substrate 103.

The acoustic wave substrate 101 is mounted on the ceramic substrate 103 such that the main surface thereof having the IDT electrodes 102 faces toward the ceramic substrate 103. Note that a gap of a predetermined size is provided between the ceramic substrate 103 and the acoustic wave substrate 101.

The acoustic wave substrate 101 is sealed with sealing resin 104. The sealing resin 104 is not present in the gap between the ceramic substrate 103 and the acoustic wave substrate 101. Therefore, a hollow 105 is provided between the ceramic substrate 103 and the acoustic wave substrate 101. The hollow 105 is provided so as not to hinder the vibration of the IDT electrodes 102.

The acoustic wave device 1100 is irradiated with laser light applied to the top surface of the sealing resin 104, whereby holes are provided therein for displaying a product number, a lot number, or the like. To increase the visibility, the holes to be provided need to have a satisfactory depth.

In the acoustic wave device 1100, if holes representing a product number, a lot number, or the like are provided by applying laser light to the top surface of the sealing resin 104, the holes need to be bottomed. The reason for this is as follows.

As described above, the acoustic wave device 1100 includes the acoustic wave substrate 101 made of, for example, lithium tantalate ($LiTaO_3$). The acoustic wave substrate 101 made of lithium tantalate is transparent or translucent. Therefore, when laser light is applied to the acoustic wave substrate 101, the acoustic wave substrate 101 transmits the laser light. Thus, if holes provided by applying laser light to the top surface of the sealing resin 104 for displaying a product number or the like on the acoustic wave device 1100 extends through the sealing resin 104 and reaches the top surface of the acoustic wave substrate 101, the laser light may be instantly transmitted through the acoustic wave substrate 101 and reach the IDT electrodes 102 provided on the lower main surface of the acoustic wave substrate 101. In such an event, the laser light may damage the IDT electrodes 102.

Therefore, to display a product number or the like on the acoustic wave device 1100 by providing holes therein with laser light applied to the top surface of the sealing resin 104, the holes need to be bottomed so as to prevent the laser light from reaching the top surface of the acoustic wave substrate 101. Furthermore, a satisfactory distance needs to be provided between the bottom surface of each of the bottomed holes and the top surface of the acoustic wave substrate 101.

An acoustic wave substrate 101 made of lithium niobate ($LiNbO_3$) is also transparent or translucent and transmits laser light. Therefore, the holes need to be bottomed.

Recently, the size reduction of electronic apparatuses has been accelerated, and there has been a strong demand for smaller or shorter electronic components, including acoustic wave devices, to be used in the electronic apparatuses. However, to display a product number or the like on the acoustic wave device 1100 by providing bottomed holes therein with laser light applied to the top surface of the sealing resin 104, the thickness of the sealing resin 104 from the top surface of the sealing resin 104 to the top surface of the acoustic wave substrate 101 needs to be set to the sum of the depth of the bottomed hole and the distance from the bottom surface of the bottomed hole to the top surface of the acoustic wave substrate 101. Under such circumstances, the acoustic wave device 1100 has a problem in that it is difficult to reduce the height thereof because the thickness of the sealing resin 104 from the top surface of the sealing resin 104 to the top surface of the acoustic wave substrate 101 tends to be large.

SUMMARY OF THE INVENTION

Preferred embodiments of the present invention provide the following solution to the problems described above.

An acoustic wave device according to a preferred embodiment of the present invention includes an acoustic wave substrate including a first main surface and a second main surface that are opposite each other, an IDT electrode provided on the first main surface, and sealing resin covering at least the second main surface of the acoustic wave substrate. A hollow where the sealing resin is absent is provided in a region where the IDT electrode on the first main surface of the acoustic wave substrate is located. The sealing resin includes a through-hole extending from a top surface of the sealing resin to the second main surface of the acoustic wave substrate. The acoustic wave substrate is made of silicon or includes a layer made of silicon.

Silicon has a lower transmittance to laser light than substances, for example, lithium tantalate ($LiTaO_3$) and lithium niobate (LiNbO₃). Therefore, when laser light is applied to silicon, the silicon does melt but does not instantly transmit the laser light.

According to a preferred embodiment of the present invention, a cover member is provided on a side of the acoustic wave substrate toward which the first main surface faces, with a gap of a predetermined size provided between the first main surface and the cover member. Accordingly, a hollow is able to be easily provided in the region where the IDT electrode on the first main surface of the acoustic wave substrate is located.

According to a preferred embodiment of the present invention, the acoustic wave substrate is a multilayer substrate, the multilayer substrate includes a high-velocity layer and a low-velocity layer, and the high-velocity layer is made of the silicon. Accordingly, the transmission of laser light is able to be significantly reduced or prevented by the high-velocity layer.

An acoustic wave device according to a preferred embodiment of the present invention includes an acoustic wave substrate including a first main surface and a second main surface; an IDT electrode provided on the first main surface; a cover member provided on a side of the acoustic wave substrate toward which the first main surface faces, with a gap of a predetermined size provided between the first main surface and the cover member; and sealing resin covering at least the cover member provided on the acoustic wave substrate. A hollow where the sealing resin is absent is provided in a region where the IDT electrode on the first main surface of the acoustic wave substrate is located. The sealing resin has a through-hole extending from a top surface of the sealing resin to the cover member. The cover member is made of silicon or includes a layer made of silicon.

In the acoustic wave devices according to the above-described preferred embodiments of the present invention, the through-hole may preferably be provided in the sealing resin to define a line. In addition, the through-hole may represent at least one of a letter, a numeral, a symbol, and a mark.

According to a preferred embodiment of the present invention, the sealing resin has a different color from the second main surface of the acoustic wave substrate or the cover member, the second main surface or the cover member being exposed at a bottom of the through-hole. Accordingly, the letter, the numeral, the symbol, the mark, or the like represented by the through-hole is displayed with increased visibility.

According to a preferred embodiment of the present invention, the second main surface of the acoustic wave substrate or the cover member includes a recess continuous with the through-hole, the second main surface or the cover member being exposed at a bottom of the through-hole. Accordingly, the depth of the recess is added to the depth of the through-hole. Therefore, the letter, the numeral, the symbol, the mark, or the like is displayed with increased visibility.

In an acoustic wave device according to a preferred embodiment of the present invention, the hole provided in the top surface of the sealing resin is a through-hole extending from the top surface of the sealing resin to the second main surface of the acoustic wave substrate or the cover member and is not a bottomed hole. Therefore, the thickness of the sealing resin from the top surface of the sealing resin to the second main surface of the acoustic wave substrate or the cover member is able to be made small. That is, in an acoustic wave device according to a preferred embodiment of the present invention, the thickness of the sealing resin in the above region does not need to include the distance from the bottom surface of the bottomed hole to the top surface of the acoustic wave substrate. Therefore, the thickness of the sealing resin is able to be made small. Hence, an acoustic wave device according to a preferred embodiment of the present invention is able to have a smaller height than in a case where the hole provided in the top surface of the sealing resin is a bottomed hole.

Furthermore, in an acoustic wave device according to a preferred embodiment of the present invention, the acoustic wave substrate or the cover member is made of silicon or includes a layer made of silicon. Therefore, when the hole is provided in the top surface of the sealing resin by applying laser light thereto, the laser light is less likely to reach the IDT electrode and is less likely to damage the IDT electrode.

The above and other elements, features, steps, characteristics and advantages of the preferred embodiments of the present invention will become more apparent from the following detailed description of the preferred embodiments with reference to the attached drawings.

DETAILED DESCRIPTION OF THE PREFERRED EMBODIMENTS

Figure 1:
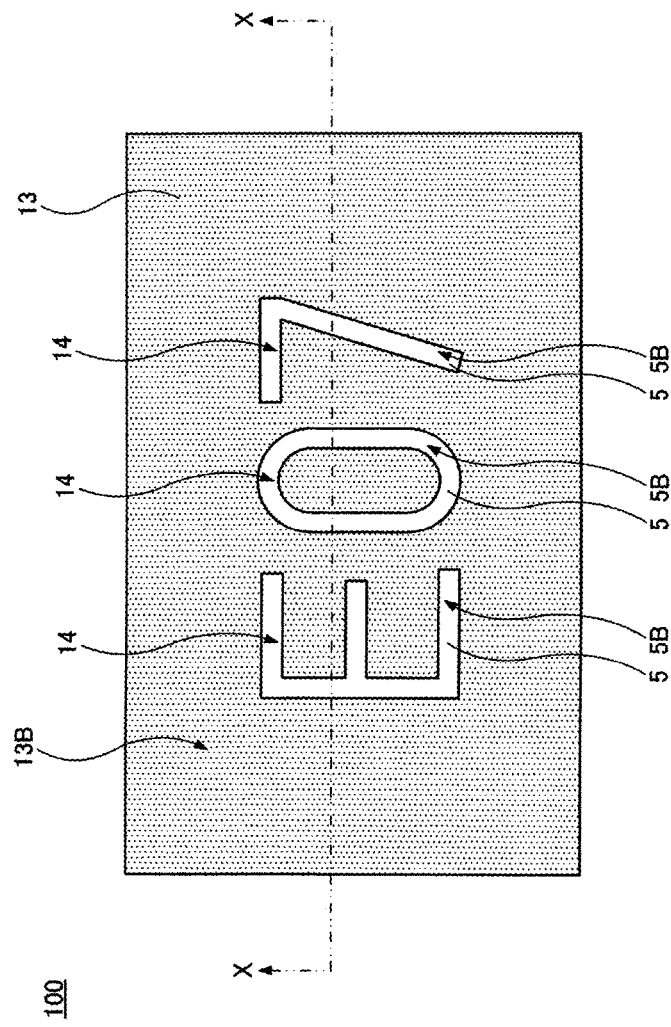
FIG. 1 is a plan view of an acoustic wave device 100 according to a first preferred embodiment of the present invention.

Preferred embodiments of the present invention will now be described with reference to the drawings.

The following are only examples of preferred embodiments of the present invention, and the present invention is not limited thereto. Features described in different preferred embodiments may be combined to provide other preferred embodiments, which are also included in the present invention. The drawings are only to assist the understanding of this specification and may be schematic. Therefore, the dimensional ratio of each of elements shown in the drawings or the dimensional ratio between different ones of the elements may not necessarily be the same as those described herein. Some of the elements described herein may be omitted in the drawings, or the number of elements of the same or similar type shown in the drawings may be smaller than described herein.

First Preferred Embodiment

Figure 2:
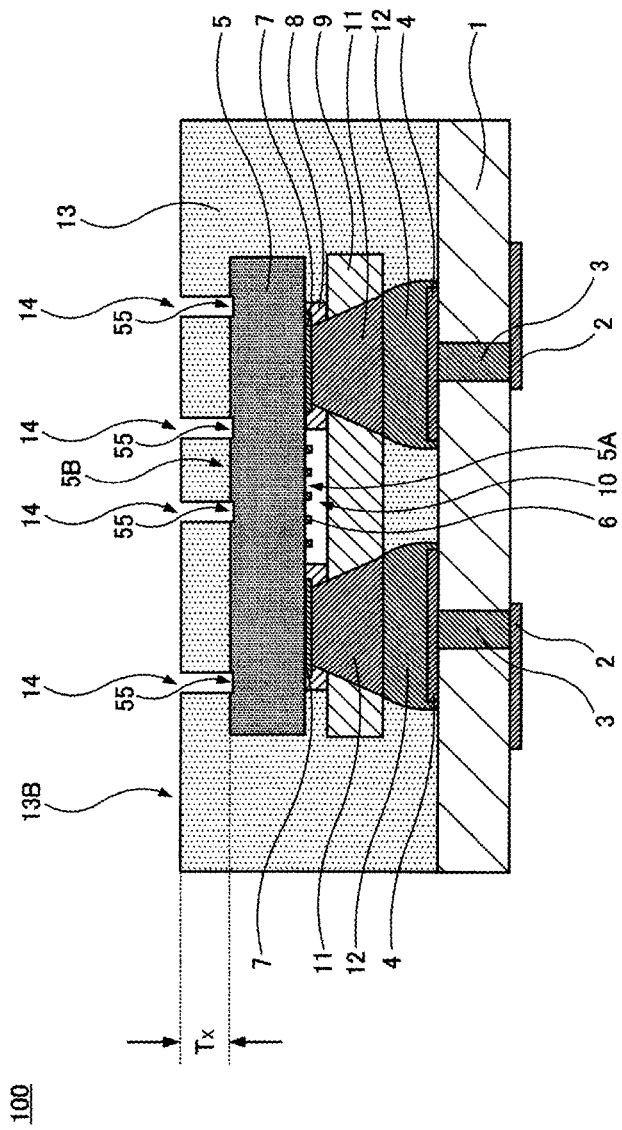
FIG. 2 is a sectional view of the acoustic wave device 100.
Figure 3:
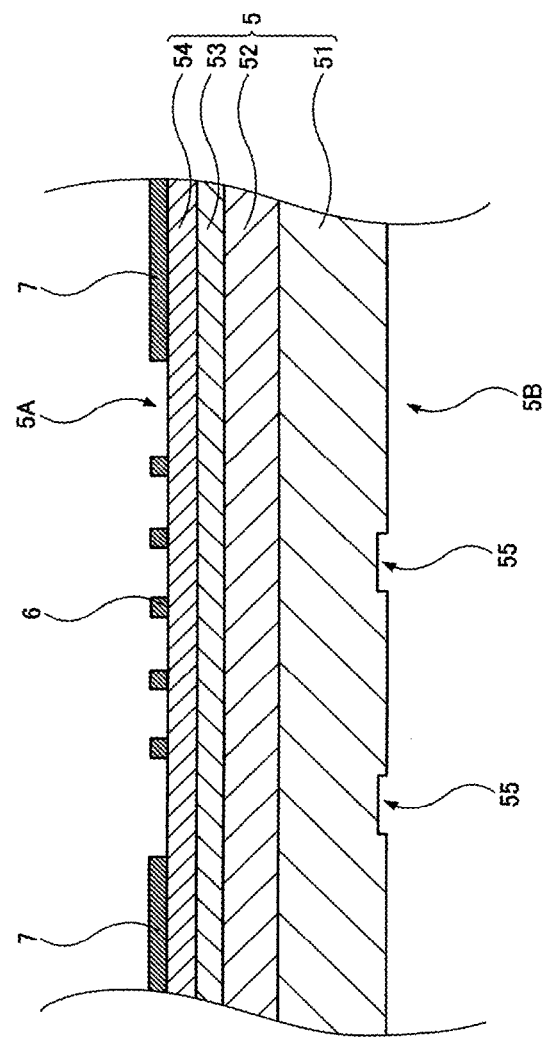
FIG. 3 is a sectional view of a portion of the acoustic wave device 100.

FIGS. 1 to 3 show an acoustic wave device 100 according to a first preferred embodiment of the present invention. FIG. 1 is a plan view of the acoustic wave device 100. FIG.

2 is a sectional view of the acoustic wave device 100, taken along a one-dot chain line X-X shown in FIG. 1. FIG. 3 is a sectional view of a portion of the acoustic wave device 100 and shows an acoustic wave substrate 5 included therein. The acoustic wave substrate 5 shown in FIG. 3 is vertically inverted from that shown in FIG. 2. In FIG. 2, individual layers included in the acoustic wave substrate 5, which is a multilayer substrate, are collectively shown as a single layer.

The acoustic wave device 100 includes a base substrate 1. In the first preferred embodiment, the base substrate 1 is preferably made of ceramic, more specifically, alumina, for example. The material of the base substrate 1 is arbitrary. The base substrate 1 may be made of ceramic other than alumina, or another material, for example, glass ceramic, resin, or the like instead of ceramic.

The base substrate 1 is provided with outer electrodes 2 on a lower main surface thereof. Furthermore, the base substrate 1 is provided with via electrodes 3 embedded therein. Furthermore, the base substrate 1 is provided with mounting electrodes 4 on an upper main surface thereof. The outer electrodes 2 and the mounting electrodes 4 are electrically connected to each other with the via electrodes 3, respectively. In the first preferred embodiment, the base substrate 1 is a single-layer substrate. Therefore, only the via electrodes 3 are embedded in the base substrate 1. If the base substrate 1 is a multilayer substrate, interlayer electrodes may also be embedded in the base substrate 1. The outer electrodes 2, the via electrodes 3, and the mounting electrodes 4 are preferably made of a material such as silver, copper, or the like, for example.

The acoustic wave device 100 includes the acoustic wave substrate 5. The acoustic wave substrate 100 is preferably made of silicon or includes a layer made of silicon. The acoustic wave substrate 100 may preferably be made of poly-crystal silicon or include a layer of made of poly-crystal silicon. Alternatively, the acoustic wave substrate 100 may be made of single-crystal silicon or include a layer of made of single-crystal silicon. In the first preferred embodiment, as shown in FIG. 3, the acoustic wave substrate 5 is a multilayer substrate. Specifically, the acoustic wave substrate 5 is a stack including a first high-velocity layer 51 defining and functioning as a supporting substrate as well, a second high-velocity layer 52, a low-velocity layer 53, and a piezoelectric layer 54.

In the present application, the term "high-velocity layer" refers to a layer in which a bulk wave propagates at a higher acoustic velocity than in the piezoelectric layer. The term "low-velocity layer" refers to a layer in which a bulk wave propagates at a lower acoustic velocity than in the piezoelectric layer.

The first high-velocity layer 51 is preferably made of silicon (Si), for example, poly-crystal silicon or single-crystal silicon. The material of the first high-velocity layer 51 is arbitrary and is not limited to silicon. The first high-velocity layer 51 defines and functions as a supporting substrate.

When laser light is applied to the first high-velocity layer 51 made of silicon, the first high-velocity layer 51 does melt but does not instantly transmit the laser light.

The second high-velocity layer 52 is preferably made of, for example, aluminum nitride (AlN), silicon nitride (SiN), or the like. The material of the second high-velocity layer 52 is arbitrary and is not limited to aluminum nitride or silicon nitride.

The low-velocity layer 53 is preferably made of, for example, silicon oxide ($SiO_2$) or the like. The material of the low-velocity layer 53 is arbitrary and is not limited to silicon oxide.

The piezoelectric layer 54 is preferably made of, for example, lithium tantalate ($LiTaO_3$), lithium niobate ($LiNbO_3$), or the like. The piezoelectric layer 54 made of lithium tantalate or lithium niobate is transparent or translucent. Therefore, when laser light is applied to the piezoelectric layer 54, the piezoelectric layer 54 transmits the laser light. However, the material of the piezoelectric layer 54 is arbitrary and is not limited to lithium tantalate or lithium niobate.

The acoustic wave substrate 5 includes a first main surface 5A and a second main surface 5B. The first main surface 5A is the main surface shown on the lower side in FIG. 2 and the upper side in FIG. 3. The second main surface 5B is the main surface shown on the upper side in FIG. 2 and on the lower side in FIG. 3.

The first main surface 5A of the acoustic wave substrate 5 is provided with IDT electrodes 6 and terminal electrodes 7. The material of the IDT electrodes 6 is arbitrary. For example, the IDT electrodes 6 may preferably be made of a metal selected from Pt, Au, Ag, Cu, Ni, W, Ta, Fe, Cr, Al, and Pd; or an alloy including one or more of the foregoing metals. The IDT electrodes 6 may each have a multilayer structure including a plurality of the above metals and alloys. The material of the terminal electrodes 7 is arbitrary. For example, the terminal electrodes 7 are preferably made of aluminum. The IDT electrodes 6 and the terminal electrodes 7 are electrically connected to each other with wire electrodes (not shown), respectively.

As in the acoustic wave substrate 5, if the low-velocity layer 53 is provided on the high-velocity layer (including the first high-velocity layer 51 and the second high-velocity layer 52), the piezoelectric layer 54 is provided on the low-velocity layer 53, and the IDT electrodes 6 are provided on the piezoelectric layer 54; a large portion of an acoustic wave excited by the IDT electrodes 6 is able to be confined in the piezoelectric layer 54 and the low-velocity layer 53. Therefore, if the acoustic wave substrate 5 is employed, the propagation loss in the acoustic wave is able to be significantly reduced. Accordingly, the insertion loss in the acoustic wave device 100 is able to be significantly reduced.

In the acoustic wave substrate 5, the second high-velocity layer 52 may be omitted, with the low-velocity layer 53 being directly provided on the first high-velocity layer 51 defining and functioning as a supporting substrate. Accordingly, a large portion of the acoustic wave excited by the IDT electrodes 6 is able to be confined in the piezoelectric layer 54 and the low-velocity layer 53.

The first main surface 5A of the acoustic wave substrate 5 is provided with an annular supporting layer 8. The supporting layer 8 is preferably made of, for example, photosensitive polyimide. The supporting layer 8 surrounds the IDT electrodes 6. The supporting layer 8 is provided over the terminal electrodes 7.

A cover member 9 is bonded to the supporting layer 8. The cover member 9 is preferably, for example, a film made of epoxy resin.

A combination of the first main surface 5A of the acoustic wave substrate 5, the annular supporting layer 8, and the cover member 9 defines a hollow 10. The IDT electrodes 6 are located in the hollow 10. Since the IDT electrodes 6 are located in the hollow 10, vibration of the IDT electrodes 6 is not hindered by the sealing resin 13, which will be described separately below.

The cover member 9 and the supporting layer 8 include through-holes extending therethrough. A conductive material is provided in the through-holes to define under-bump metals (UBMs) 11. The UBMs 11 preferably made of, for example, primarily nickel.

The UBMs 11 and the mounting electrodes 4 on the base substrate 1 are bonded to each other with bumps 12, respectively. Thus, the acoustic wave substrate 5 provided with the cover member 9 is mounted on the base substrate 1. In the first preferred embodiment, solder bumps are provided as the bumps 12. The kind of the bumps 12 is arbitrary. As an alternative to solder bumps, for example, gold bumps or the like may be used.

The sealing resin 13 is provided on the base substrate 1 and covers the acoustic wave substrate 5. In the first preferred embodiment, epoxy resin, for example, is preferable used as the sealing resin 13. The material of the sealing resin 13 is arbitrary and may be, for example, polyimide resin or the like.

In the first preferred embodiment, the sealing resin 13 has a different color from the first high-velocity layer 51, which defines the second main surface 5B of the acoustic wave substrate 5.

The sealing resin 13 includes through-holes 14 extending from a top surface 13B thereof. The through-holes 14 define lines representing numerals, symbols, letters, marks, or the like to be displayed. The numerals, symbols, and letters indicate information on the acoustic wave device 100: for example, the manufacturer, the product number, the lot number, the date of manufacture, the place of manufacture, or the like. The marks indicate, for example, the orientation of the acoustic wave device 100. To ensure the visibility of the letters, numerals, symbols, marks, or the like, the through-holes 14 each have a predetermined depth.

The through-holes 14 are provided by applying laser light to the top surface 13B of the sealing resin 13. The through-holes 14 each reach the second main surface 5B (the first high-velocity layer 51) of the acoustic wave substrate 5. Therefore, the laser light is further applied to the second main surface 5B of the acoustic wave substrate 5, and recesses 55 are provided in the second main surface 5B (the first high-velocity layer 51) of the acoustic wave substrate 5.

In the acoustic wave device 100, the holes provided in the top surface 13B of the sealing resin 13 to display numerals, symbols, letters, marks, or the like are not bottomed holes, and the through-holes 14 each extend to the second main surface 5B of the acoustic wave substrate 5. Therefore, a thickness $T_X$ of the sealing resin 13 from the top surface 13B of the sealing resin 13 to the second main surface 5B of the acoustic wave substrate 5 is allowed to be small. That is, in the acoustic wave device 100, the first high-velocity layer 51 defining the second main surface 5B of the acoustic wave substrate 5 is preferably made of silicon (Si), for example, poly-crystal silicon or single-crystal silicon, which is less likely to transmit laser light. Therefore, the laser light reaching the second main surface 5B of the acoustic wave substrate 5 is less likely to be transmitted through the acoustic wave substrate 5 because of the presence of the first high-velocity layer 51. Thus, the IDT electrodes 6 provided on the first main surface 5A of the acoustic wave substrate 5 are less likely to be damaged by the laser light. Thus, in the acoustic wave device 100, the holes that display numerals, symbols, letters, marks, or the like are able to be provided as the through-holes 14 each reaching the second main surface 5B of the acoustic wave substrate 5. Therefore, the thickness $T_X$ of the sealing resin 13 from the top surface 13B of the sealing resin 13 to the second main surface 5B of the acoustic wave substrate 5 is able to be made small.

Figure 4:
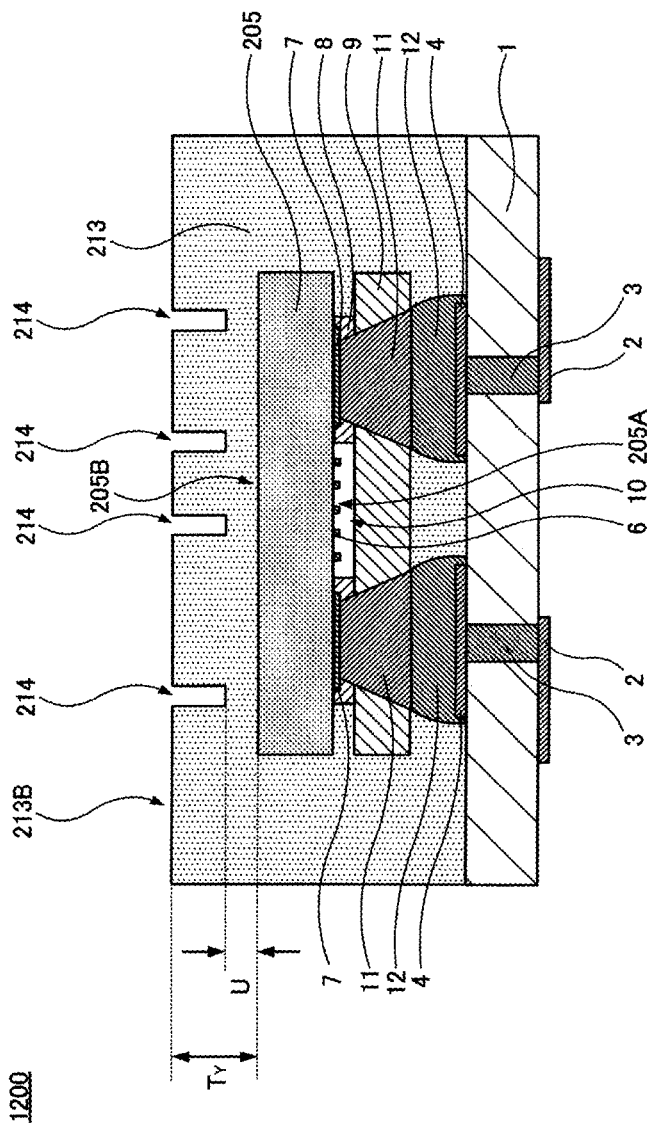
FIG. 4 is a sectional view of an acoustic wave device 1200 according to a comparative example.

FIG. 4 shows an acoustic wave device 1200 according to a comparative example. The acoustic wave device 1200 is provided by modifying a portion of the acoustic wave device 100 according to the first preferred embodiment. Specifically, the acoustic wave device 1200 includes an acoustic wave substrate 205 including a single-layer structure the entirety or substantially the entirety of which in the thickness direction is preferably made of a transparent or translucent material, for example, lithium tantalate (LiTaO$_3$) or lithium niobate (LiNbO$_3$). Therefore, to display any numerals, symbols, letters, marks, or the like on the acoustic wave device 1200 by providing holes with laser light applied to a top surface 213B of sealing resin 213, the holes need to be bottomed holes 214. This is because of the following. When laser light reaches a second main surface 205B of the acoustic wave substrate 205, the laser light is instantly transmitted through the acoustic wave substrate 205 and reaches a first main surface 205A of the acoustic wave substrate 205, which may damage the IDT electrodes 6. Therefore, the acoustic wave device 1200 has a problem in that a thickness $T_Y$ of the sealing resin 213 from the top surface 213B of the sealing resin 213 to the second main surface 205B of the acoustic wave substrate 205 needs to be a distance U from the bottom surfaces of the bottomed holes 214 to the second main surface 205B of the acoustic wave substrate 205, which makes the thickness $T_Y$ large. In the known art, the distance U needs to be at least about 30 μm.

In contrast, in the acoustic wave device 100 according to the first preferred embodiment, since the holes that display numerals, symbols, letters, marks, or the like are the through-holes 14, the thickness $T_X$ of the sealing resin 13 from the top surface 13B of the sealing resin 13 to the second main surface 5B of the acoustic wave substrate 5 is able to be made small. Thus, the acoustic wave device 100 is able to have a significantly reduced height by reducing the thickness $T_X$ of the sealing resin 13 from the top surface 13B of the sealing resin 13 to the second main surface 5B of the acoustic wave substrate 5.

Furthermore, in the acoustic wave device 100, the first high-velocity layer 51 defining the second main surface 5B of the acoustic wave substrate 5 and being exposed at the bottoms of the through-holes 14 preferably has different color from the sealing resin 13. Therefore, the numerals, symbols, letters, marks, or the like represented by the through-holes 14 are highly visible.

Furthermore, in the acoustic wave device 100, the second main surface 5B of the acoustic wave substrate 5 includes the recesses 55 that are continuous with the through-holes 14, respectively. Therefore, the through-holes 14 each have a large depth. Thus, the numerals, symbols, letters, marks, or the like represented by the through-holes 14 of the acoustic wave device 100 are highly visible.

The acoustic wave device 100 is manufacturable by a known method that is widely used to manufacture an acoustic wave device. An exemplary method of manufacturing the acoustic wave device 100 will now be described briefly.

First, an acoustic wave substrate 5 in which a first high-velocity layer 51, a second high-velocity layer 52, a low-velocity layer 53, and a piezoelectric layer 54 are stacked is fabricated by a publicly known method.

Subsequently, IDT electrodes 6 and terminal electrodes are formed on a first main surface 5A of the acoustic wave substrate 5 by a deposition technique.

Subsequently, an annular supporting layer 8 preferably made of, for example, photosensitive polyimide is formed on the first main surface 5A of the acoustic wave substrate 5 by a photolithographic technique.

Subsequently, a cover member 9 in the form of a roll is unrolled over the supporting layer 8 and is press-bonded thereto.

Subsequently, through-holes are provided in the supporting layer 8 and the cover member 9 by a method such as laser-light application, for example. Subsequently, metal is precipitated on the terminal electrodes 7, which are exposed at the bottoms of the through-holes, by plating or the like, and UBMs 11 are formed.

Subsequently, bumps 12 are formed on the UBMs 11, respectively, by, for example, a stud bump method.

Meanwhile, a base substrate 1 provided with outer electrodes 2, via electrodes 3, and mounting electrodes 4 is fabricated by a publicly known method.

Subsequently, the acoustic wave substrate 5 provided with the cover member 9 is mounted on the mounting electrodes 4 of the base substrate 1 with the aid of the bumps 12.

Subsequently, sealing resin 13 is provided on the base substrate 1 to cover the acoustic wave substrate 5.

Subsequently, laser light is applied to the sealing resin 13 to provide through-holes 14 representing numerals, symbols, letters, marks, or the like. Specifically, through-holes are provided by applying laser light until the second main surface 5B (the first high-velocity layer 51) of the acoustic wave substrate 5 is exposed. Then, the laser light is moved to write the numerals, symbols, letters, marks, or the like to be displayed. The laser light is preferably, for example, visible light.

Through the above process, an acoustic wave device 100 according to the first preferred embodiment is provided.

Second Preferred Embodiment

Figure 5:
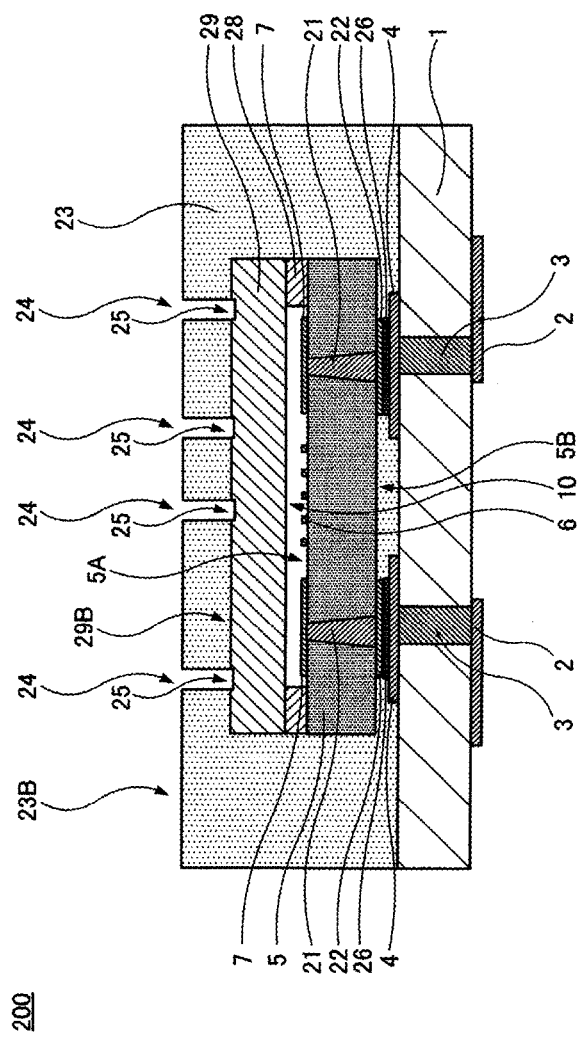
FIG. 5 is a sectional view of an acoustic wave device 200 according to a second preferred embodiment of the present invention.

FIG. 5 shows an acoustic wave device 200 according to a second preferred embodiment of the present invention. FIG. 5 is a sectional view of the acoustic wave device 200.

The acoustic wave device 200 according to the second preferred embodiment is provided by modifying the acoustic wave device 100 according to the first preferred embodiment. Specifically, in the acoustic wave device 100, the acoustic wave substrate 5 provided with the cover member 9 is mounted on the base substrate 1, and the cover member 9 is located on the lower side while the acoustic wave substrate 5 is located on the upper side. On the other hand, in the acoustic wave device 200, the positional relationship between the two is vertically inverted. Specifically, the acoustic wave substrate 5 provided with a cover member 29 is mounted on the base substrate 1, and the acoustic wave substrate 5 is located on the lower side while the cover member 29 is located on the upper side. Such a configuration will now be described briefly.

The acoustic wave device 200 includes a base substrate 1 provided with outer electrodes 2, via electrodes 3, and mounting electrodes 4.

The acoustic wave device 200 further includes an acoustic wave substrate 5 in which a first high-velocity layer 51 defining and functioning as a supporting substrate, a second high-velocity layer 52, a low-velocity layer 53, and a piezoelectric layer 54 are stacked (see FIG. 3 for the features of the acoustic wave substrate 5). The acoustic wave substrate 5 includes the same or similar features as the acoustic wave device 100, except some additional elements to be described below.

The acoustic wave substrate 5 is provided with IDT electrodes 6 and terminal electrodes 7 on a first main surface (a main surface on the upper side in FIG. 5) 5A thereof.

The acoustic wave substrate 5 is additionally provided with connecting electrodes 22 on a second main surface (a main surface on the lower side in FIG. 5) 5B thereof.

Furthermore, the acoustic wave substrate 5 is additionally provided with via electrodes 21 each extending through the acoustic wave substrate 5 from the first main surface 5A to the second main surface 5B. The via electrodes 21 electrically connect the terminal electrodes 7 and the connecting electrodes 22 to each other, respectively.

The acoustic wave substrate 5 is provided with an annular supporting layer 28 on the first main surface 5A. The supporting layer 28 is located on the outer side of the IDT electrodes 6 and the terminal electrodes 7 provided on the first main surface 5A of the acoustic wave substrate 5.

A cover member 29 is bonded to the supporting layer 28. In the second preferred embodiment, the cover member 29 is preferably made of silicon, for example, poly-crystal silicon or single-crystal silicon. When laser light is applied to the cover member 29 made of silicon, the cover member 29 does melt but does not instantly transmit the laser light.

A combination of the first main surface 5A of the acoustic wave substrate 5, the annular supporting layer 28, and the cover member 29 defines a hollow 10.

In the acoustic wave device 200, the acoustic wave substrate 5 provided with the cover member 29 is mounted on the base substrate 1, and the acoustic wave substrate 5 is located on the lower side while the cover member 29 is located on the upper side. Specifically, the connecting electrodes 22 on the acoustic wave substrate 5 are bonded to the mounting electrodes 4, respectively, on the base substrate 1 with a bonding material 26, for example, solder, conductive adhesive, or the like.

Sealing resin 23 is provided on the base substrate 1 and covers the cover member 29.

The sealing resin 23 includes through-holes 24 extending from a top surface 23B thereof. The through-holes 24 define lines representing numerals, symbols, letters, marks, or the like to be displayed.

The through-holes 24 are provided by applying laser light to the top surface 23B of the sealing resin 23. The through-holes 24 each reach a top surface 29B of the cover member 29. Therefore, the laser light is further applied to the cover member 29, and recesses 25 are provided in the cover member 29.

In the acoustic wave device 200, the cover member 29 is preferably made of silicon, for example, poly-crystal silicon or single-crystal silicon, which is less likely to transmit laser light. Therefore, the laser light reaching the cover member 29 is not instantly transmitted through the cover member 29. Thus, in the acoustic wave device 200, there is no chance that the laser light may reach the hollow 10 and damage the IDT electrodes 6 provided on the first main surface 5A of the acoustic wave substrate 5. Thus, in the acoustic wave device 200, the holes that display numerals, symbols, letters, marks, or the like are able to be provided as the through-holes 24. Therefore, the thickness of the sealing resin 23 from the top surface 23B of the sealing resin 23 to the top surface 29B of the cover member 29 is able to be made small. Therefore, the acoustic wave device 200 is able to also have a significantly reduced height by reducing the thickness of the sealing resin 23 from the top surface 23B of the sealing resin 23 to the top surface 29B of the cover member 29.

Third Preferred Embodiment

Figure 6:
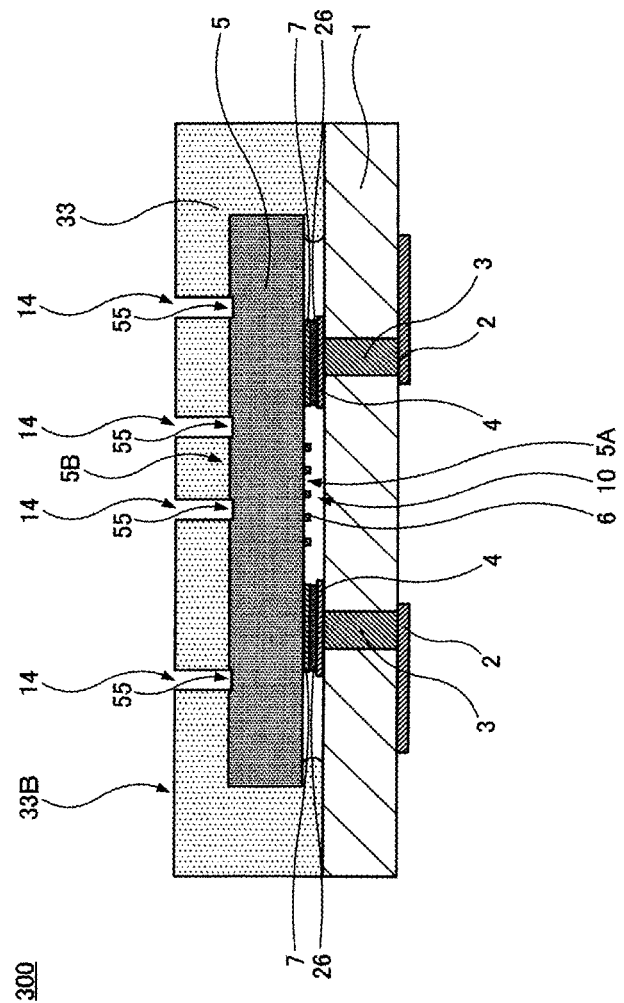
FIG. 6 is a sectional view of an acoustic wave device 300 according to a third preferred embodiment of the present invention.
Figure 7:
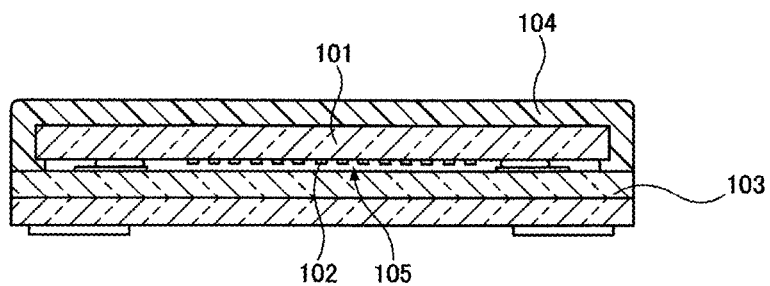
FIG. 7 is a sectional view of an acoustic wave device 1100 disclosed by Japanese Unexamined Patent Application Publication No. 2009-21559.

FIG. 6 shows an acoustic wave device 300 according to a third preferred embodiment of the present invention. FIG. 6 is a sectional view of the acoustic wave device 300.

The acoustic wave device 300 according to the third preferred embodiment is also provided by modifying the acoustic wave device 100 according to the first preferred embodiment. Specifically, in the acoustic wave device 100, the cover member 9 is provided over the acoustic wave substrate 5, and the hollow 10 is provided. The acoustic wave device 300 is modified and the cover member 9 is omitted, that is, the hollow 10 is provided without providing the cover member 9. Such a configuration will now be described briefly.

The acoustic wave device 300 includes a base substrate 1 provided with outer electrodes 2, via electrodes 3, and mounting electrodes 4.

The acoustic wave device 300 includes an acoustic wave substrate 5 in which a first high-velocity layer 51 defining and functioning as a supporting substrate, a second high-velocity layer 52, a low-velocity layer 53, and a piezoelectric layer 54 are stacked (see FIG. 3 for the features of the acoustic wave substrate 5).

The acoustic wave substrate 5 is provided with IDT electrodes 6 and terminal electrodes 7 on a first main surface (a main surface on the lower side in FIG. 6) 5A thereof.

In the acoustic wave device 300, the terminal electrodes on the acoustic wave substrate 5 are bonded to the mounting electrodes 4, respectively, on the base substrate 1 with a bonding material 26, for example, solder, conductive adhesive, or the like.

Sealing resin 33 is provided on the base substrate 1 and covers the acoustic wave substrate 5. The sealing resin 33 is not present in the gap between the base substrate 1 and the acoustic wave substrate 5. Therefore, a hollow 10 is provided between the base substrate 1 and the acoustic wave substrate 5.

The sealing resin 33 includes through-holes 14 extending from a top surface 33B thereof. The through-holes 14 define lines representing numerals, symbols, letters, marks, or the like to be displayed.

As with the case of the acoustic wave device 300, if the acoustic wave substrate 5 is mounted on the base substrate 1 and the second main surface 5B of the acoustic wave substrate 5 faces toward the upper side, the cover member may be omitted.

The acoustic wave devices 100, 200, and 300 according to the first to third preferred embodiments have been described above. However, the present invention is not limited to the above preferred embodiments and may be modified in various ways in accordance with the spirit of the present invention.

For example, in the acoustic wave devices 100 and 300, the acoustic wave substrate 5 has a multilayer structure in which the first high-velocity layer 51 defining and functioning as a supporting substrate, the second high-velocity layer 52, the low-velocity layer 53, and the piezoelectric layer 54 are stacked, with the first high-velocity layer 51 providing a function of significantly reducing or preventing the transmission of laser light. Alternatively, in the acoustic wave devices 100 and 300, the acoustic wave substrate may not necessarily be a multilayer substrate and may be a piezoelectric single-layer substrate made of a material that significantly reduces or prevents the transmission of laser light.

In the acoustic wave device 200, the acoustic wave substrate 5 has a multilayer structure in which the first high-velocity layer 51 defining and functioning as a supporting substrate as well, the second high-velocity layer 52, the low-velocity layer 53, and the piezoelectric layer 54 are stacked, with the first high-velocity layer 51 providing a function of significantly reducing or preventing the transmission of laser light. However, in the acoustic wave device 200, since the acoustic wave substrate 5 provided with the cover member 29 is mounted on the base substrate 1, and the acoustic wave substrate 5 is located on the lower side while the cover member 29 is located on the upper side, the acoustic wave substrate may not necessarily have a function of significantly reducing or preventing the transmission of laser light. Therefore, in the acoustic wave device 200, the acoustic wave substrate may be made of a material that transmits laser light, for example, lithium tantalate, lithium niobate, or the like.

In the acoustic wave devices 100 and 300, the recesses 55 are provided in the second main surface of the acoustic wave substrate 5. In the acoustic wave device 200, the recesses 25 are provided in the top surface 29B of the cover member 29. However, the recesses 55 or the recesses 25 are not essential and may be omitted.

In the acoustic wave devices 100 and 300, the first high-velocity layer 51 of the acoustic wave substrate 5 is made of silicon as the material that is less likely to transmit laser light. In the acoustic wave device 200, the cover member 29 is made of silicon as the material that is less likely to transmit laser light. Preferred embodiments of the present invention are directed to a case where silicon is used as the material that is less likely to transmit laser light. Instead of silicon, another material, for example, alumina, sapphire, or the like is also expected to produce the above advantageous effect of significantly reducing or preventing the transmission of laser light.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   an acoustic wave substrate including a first main surface and a second main surface that are located opposite each other;
   an IDT electrode provided on the first main surface; and
   sealing resin covering at least the second main surface of the acoustic wave substrate; wherein
   a hollow where the sealing resin is absent is provided in a region where the IDT electrode on the first main surface of the acoustic wave substrate is located;
   the sealing resin includes a through-hole extending from a top surface of the sealing resin to the second main surface of the acoustic wave substrate;
   the acoustic wave substrate is made of silicon or includes a layer made of silicon;
   the through-hole represents at least one of a letter, a numeral, a symbol, and a mark to be displayed.

2. The acoustic wave device according to claim 1, wherein a cover member is provided on a side of the acoustic wave substrate toward which the first main surface faces, with a gap of a predetermined size provided between the first main surface and the cover member.

3. The acoustic wave device according to claim 1, wherein
the acoustic wave substrate is a multilayer substrate;
the multilayer substrate includes a high-velocity layer and a low-velocity layer; and
the high-velocity layer is made of the silicon.

4. The acoustic wave device according to claim 3, wherein a color of the sealing resin is different from a color of the high-velocity layer.

5. The acoustic wave device according to claim 3, wherein the high-velocity layer includes at least a first high-velocity layer and a second high-velocity layer.

6. The acoustic wave device according to claim 5, wherein
the first high-velocity layer is made of silicon;
the second high-velocity layer is made aluminum nitride or silicon nitride; and
the low-velocity layer is made of silicon oxide.

7. The acoustic wave device according to claim 1, wherein the through-hole provided in the sealing resin defines a line.

8. The acoustic wave device according to claim 1, wherein the sealing resin has a different color from the second main surface of the acoustic wave substrate or the cover member, the second main surface or the cover member being exposed at a bottom of the through-hole.

9. The acoustic wave device according to claim 1, wherein the second main surface of the acoustic wave substrate or the cover member includes a recess continuous with the through-hole, the second main surface or the cover member being exposed at a bottom of the through-hole.

10. The acoustic wave device according to claim 1, wherein the sealing resin is provided on a first surface a base substrate.

11. The acoustic wave device according to claim 10, wherein the base substrate includes ceramic.

12. The acoustic wave device according to claim 10, wherein the base substrate includes a mounting electrode that is electrically connected to the IDT electrode.

13. The acoustic wave device according to claim 1, wherein the sealing resin is an epoxy resin.

14. The acoustic wave device according to claim 1, wherein the through-hole represents an orientation of the acoustic wave device.

15. An acoustic wave device comprising:
an acoustic wave substrate including a first main surface and a second main surface;
an IDT electrode provided on the first main surface;
a cover member provided on a side of the acoustic wave substrate toward which the first main surface faces, with a gap of a predetermined size provided between the first main surface and the cover member; and
sealing resin covering at least the cover member provided on the acoustic wave substrate; wherein
a hollow where the sealing resin is absent is provided in a region where the IDT electrode on the first main surface of the acoustic wave substrate is located;
the sealing resin includes a through-hole extending from a top surface of the sealing resin to the cover member;
the cover member is made of silicon or includes a layer made of silicon; and
the through-hole represents at least one of a letter, a numeral, a symbol, and a mark to be displayed.

16. The acoustic wave device according to claim 15, wherein the through-hole provided in the sealing resin defines a line.

17. The acoustic wave device according to claim 15, wherein the sealing resin has a different color from the second main surface of the acoustic wave substrate or the cover member, the second main surface or the cover member being exposed at a bottom of the through-hole.

18. The acoustic wave device according to claim 15, wherein the second main surface of the acoustic wave substrate or the cover member includes a recess continuous with the through-hole, the second main surface or the cover member being exposed at a bottom of the through-hole.

* * * * *